(12) United States Patent
Chiu et al.

(10) Patent No.: US 12,487,518 B2
(45) Date of Patent: Dec. 2, 2025

(54) RETICLE POD PROVIDED WITH HOLDING PINS AND METHOD FOR HOLDING RETICLE

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Hsing-Min Wen, New Taipei (TW); Yi-Hsuan Lee, New Taipei (TW); Hsin-Min Hsueh, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 325 days.

(21) Appl. No.: 17/146,747

(22) Filed: Jan. 12, 2021

(65) Prior Publication Data
US 2021/0358787 A1 Nov. 18, 2021

Related U.S. Application Data

(60) Provisional application No. 63/024,595, filed on May 14, 2020.

(51) Int. Cl.
*G03F 1/66* (2012.01)
*B65D 81/24* (2006.01)
(Continued)

(52) U.S. Cl.
CPC ............... *G03F 1/66* (2013.01); *B65D 81/24* (2013.01); *B65D 85/30* (2013.01); *G03F 1/22* (2013.01);
(Continued)

(58) Field of Classification Search
CPC .......... G03F 1/66; G03F 1/22; G03F 7/70741; H01L 21/67359; H01L 21/67386; H01L 21/67353
See application file for complete search history.

(56) References Cited

U.S. PATENT DOCUMENTS 9,958,772 B1 * 5/2018 Hsueh ............... H01L 21/67366
11,442,370 B2 * 9/2022 Chuang ............. H01L 21/67376
(Continued)

FOREIGN PATENT DOCUMENTS

JP 2019528578 A 10/2019
KR 20080069969 A 7/2008
(Continued)

*Primary Examiner* — Orlando E Aviles
*Assistant Examiner* — Jenine Pagan
(74) *Attorney, Agent, or Firm* — Troutman Pepper Locke LLP; Tim Tingkang Xia, Esq.

(57) ABSTRACT

The invention discloses a reticle pod having a lid and multiple pin assemblies. The pin assembly includes a movable member movable relatively to a ceiling of the lid and an elastic member configured to arrange the movable member in between the elastic member and the ceiling of the lid. In the case where the reticle pod is provided without receiving a reticle, the ceiling of the reticle pod determines the movable member stays at a first level. In the case where the reticle pod is provided with a reticle, the elastic member collaborates with the movable member such that the movable member holds the reticle at a second level that is higher than the first level.

21 Claims, 7 Drawing Sheets

(51) Int. Cl.
*B65D 85/30* (2006.01)
*G03F 1/22* (2012.01)
*G03F 7/00* (2006.01)
*G06K 7/14* (2006.01)
*H01L 21/67* (2006.01)
*H01L 21/673* (2006.01)

(52) U.S. Cl.
CPC .......... G03F 7/70741 (2013.01); G06K 7/14 (2013.01); H01L 21/67294 (2013.01); H01L 21/67353 (2013.01); H01L 21/67359 (2013.01); H01L 21/67366 (2013.01); H01L 21/67376 (2013.01); H01L 21/67386 (2013.01)

(56) References Cited

U.S. PATENT DOCUMENTS

| | | | |
|---|---|---|---|
| 2006/0126042 A1* | 6/2006 | Matsutori | G03F 7/70741 355/53 |
| 2012/0175279 A1* | 7/2012 | Ku | G03F 7/70741 206/454 |
| 2013/0126378 A1* | 5/2013 | Ku | B65D 85/48 206/454 |
| 2019/0214287 A1* | 7/2019 | Chiu | G03F 7/70741 |
| 2020/0211876 A1* | 7/2020 | Raschke | G03F 7/70741 |

FOREIGN PATENT DOCUMENTS

| | | |
|---|---|---|
| KR | 20180088268 A | 8/2018 |
| KR | 20190033578 A | 3/2019 |
| KR | 20190085844 A | 7/2019 |

\* cited by examiner

RETICLE POD PROVIDED WITH HOLDING PINS AND METHOD FOR HOLDING RETICLE

CROSS-REFERENCE TO RELATED PATENT APPLICATION

This non-provisional application claims priority to and the benefit of, pursuant to 35 U.S.C. § 119(e), U.S. provisional patent application Ser. No. 63/024,595 filed May 14, 2020. The disclosure of the above application is incorporated herein in its entirety by reference.

FIELD OF THE INVENTION

The present invention relates to a reticle pod, particularly to a reticle pod provided with holding pin assemblies that can interact with an outer reticle pod.

DESCRIPTION OF THE PRIOR ART

Reticle involved in Extreme Ultraviolet (EUV) manufacture process requires protection by a dedicated EUV inner pod. To hold the reticle in place and keep it from moving in the reticle inner pod when a lid and a base of the reticle inner pod engage with each other, a known approach utilizes an external force, created when the reticle inner pod is received in a reticle outer pod, to secure the reticle within the inner pod with proper mechanism that absorbs excess force. Thus, holding pin assemblies provided on the reticle inner pod play an important role.

A public patent reference, issued as the patent number TW201931007, discloses a holding pin assembly provided on a lid of a reticle inner pod, which can be forced to vertically move downward by a down-press surface of an outer pod lid so as to press the reticle by pins. In the case where the down-press surface presses downward, a pressed member of the holding pin is in parallel to a top surface of a cover of the holding pin assembly. This holding pin is a one-piece member, and the holding pin delivers a pressing force when the outer pod lid directly contacts with the holding pin.

However, it shall be realized that each of components in the reticle pod can have mechanical tolerance due to some inevitable manufacturing factors (e.g. surface deflection). For the reticle pod disclosed in the foregoing publication, the mechanical tolerance may resulted from the thickness of the reticle pod lid, base, the length of holding pin, the flatness of the pressed surface of holding pin, the height of reticle support pin as well as height of holding pin cover. The sum of these mechanical tolerances can lead to a reticle positioning that is not idea, for example, the reticle is unable to be secured in place by four holding pins, which even affects hermetical seal of the reticle pod. This problem can occur in the case where a reticle may raise up the holding pins when the reticle is received in the reticle pod, the raised holding pins then collide with its top cover structure because of the tolerance accumulated in the holding pin and holding pin cover. As a result, the pod lid is lifted, forming a gap between the lid and the base, which is negative to the hermetical seal.

In view of the precision required in reticle pod, there is a demand to develop a holding pin design able to remedy the mechanical tolerance so as to satisfy reticle storage and achieve its hermetical sealing ability.

SUMMARY OF THE INVENTION

An objective of the present invention is to provide a reticle pod having a lid and one or more pin assemblies provided on the lid. The pin assembly includes a movable member configured to be movable relatively to a ceiling of the lid, and an elastic member configured to have the movable member placed between the elastic member and the ceiling of the lid. The ceiling of the lid is configured to determine the movable member locates at a first level when the retile pod does not receive a reticle; and the elastic member is configured to cooperate with the movable member such that the movable member locates at a second level to hold a reticle when the reticle pod receives the reticle, the second level is higher than the first level.

Another objective of the present invention is to provide a reticle pod, having a lid and one or more pin assemblies provided on the lid. The pin assembly includes a movable member configured to be movable in a vertical direction relatively to a ceiling of the lid, the movable member including a cap and a pin penetrating through a hole defined on the lid and sticking out of a bottom surface of the lid; and a cover mounted on an exterior of the lid and determining a highest level at which the cap of the movable member is able to reach. The pin touches against an upper surface of a reticle when the reticle is received in the reticle pod; and the cap forces the pin to hold the reticle when the cap receives either a direct or an indirect external force.

A further objective of the present invention is to provide a method for holding a reticle in a reticle pod, the reticle pod includes a lid and a base, the lid provided with one or more pin assemblies, the pin assembly comprising a pin and a cap. The method includes: configuring the pin to be movable within a hole of the lid while sticking out of a bottom surface of the lid; providing a cover mounted on an exterior of the lid to determine a highest level at which the cap is able to reach; receiving a reticle within the reticle pod such that the pin touches against an upper surface of the reticle to thereby elevate the pin; and applying an external force to the cap in either a direct or an indirect manner to cause the cap forcing the pin to press the reticle to stabilize the reticle within the reticle pod.

BRIEF DESCRIPTION OF THE DRAWINGS

The present invention can be understood more thoroughly with reference to the accompanying drawings and the descriptions given below. Various examples, which are not intended to be limiting and exhaustive, will be described with reference to the drawings. The elements shown in the drawings are not necessarily illustrated to actual scale for the purpose of explaining the structures and relevant principles.

DETAILED DESCRIPTION OF THE PREFERRED EMBODIMENTS

A more complete description of the present invention is provided below with reference to the accompanying drawings, and examples are provided to demonstrate exemplary embodiments. Nevertheless, the claimed subject matter of the present invention can be implemented in various forms, and therefore the construction of the covered or claimed subject matters shall not be limited to any exemplary embodiment disclosed in this description; the exemplary embodiments are merely provided as examples. Likewise, the present invention is intended to provide a reasonably broad scope for the claimed or covered subject matters. Besides, for example, a claimed subject matter may be implemented as a method, device, or system. Therefore, a specific embodiment may be in the form of, for example, hardware, software, firmware, or any combination (known to be non-software) thereof.

The term "an embodiment" used in this description does not necessarily refer to exactly the same embodiment, and the term "other (some/certain) embodiments" used in this description does not necessarily refer to different embodiments. The purpose of this description is to explain the claimed subject matter using examples that include combinations of all or part of the exemplary embodiments.

Figure 1:
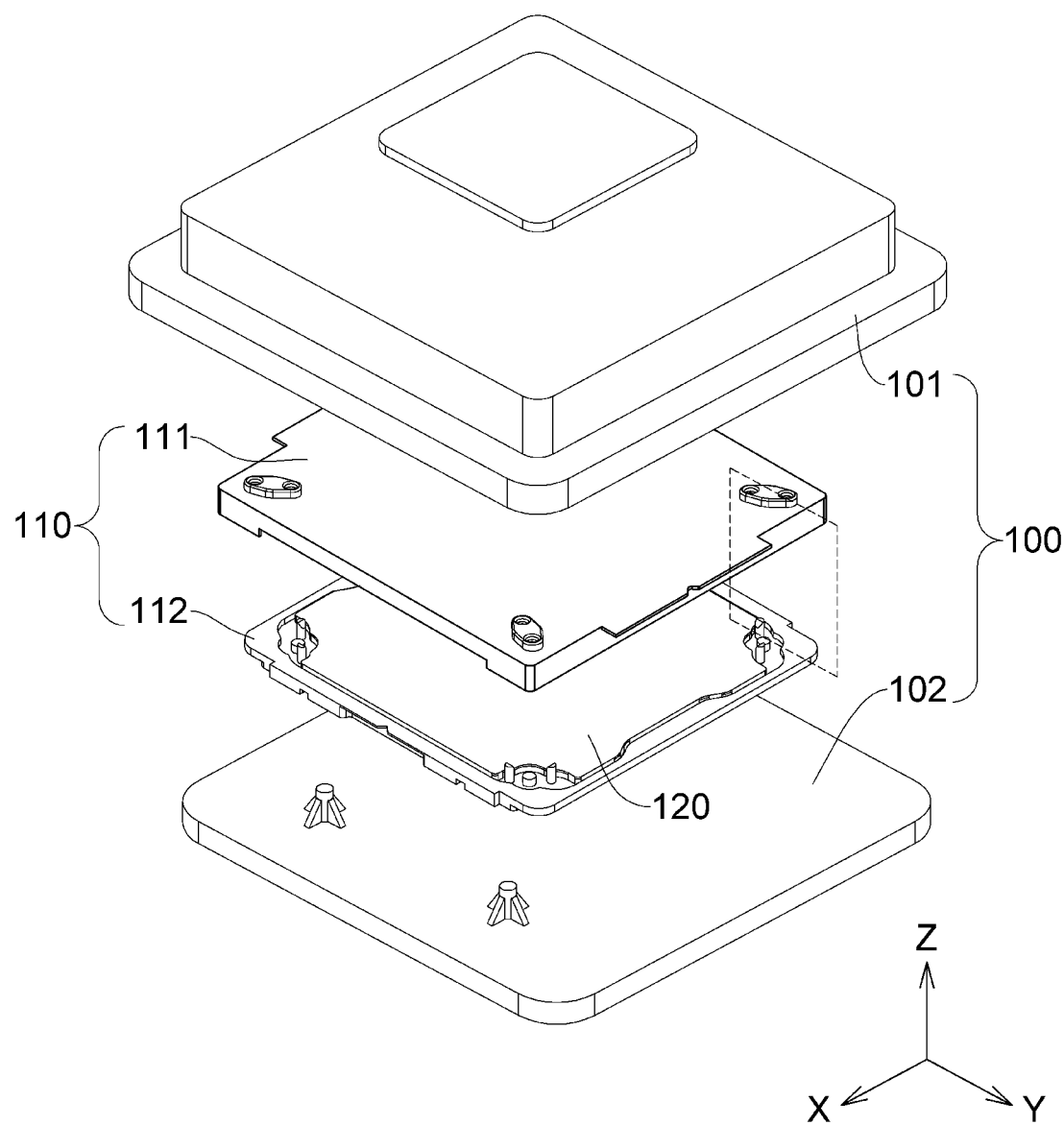
FIG. 1 is an exploded view showing a reticle outer pod and a reticle pod received therein.

FIG. 1 is an exploded view showing a reticle pod. Said reticle pod may be a EUV pod which includes an outer pod (100) and an inner pod (110). It can be realized that the terminologies of "outer pod" and "inner pod" are used to explain their spatial relationship and the normally said "reticle pod" can refer to either the outer pod or the inner pod depending on its context. The outer pod (100) has a lid (101) and a base (102), both can engage with each other to receive the inner pod (110). The inner pod (110) has a lid (111) and a base (112) which are configured to receive a reticle therein (120). The lid (111) of inner pod (110) is provided with multiple pin assemblies configured in a way that an exterior of the lid (111) of inner pod (110) can interact with an interior of the lid (101) of outer pod (100) to thereby make the pin assemblies deliver a pressing force at an inside of the lid (111). More details of the pin assembly will be described in the following paragraphs.

In addition, the outer pod (100) and the inner pod (110) may have more details that are omitted herein, only relevant parts of the present invention will be described. Despite not shown and described, a person skilled in the art can realize that in some configurations, the lid (101) of outer pod (100) may be provided with sensors; the base (102) may be provided with valves; the lid (111) of inner pod (110) may be provided with filter channel; and the base (112) of inner pod (112) may define a reticle accommodation area.

Figure 2A:
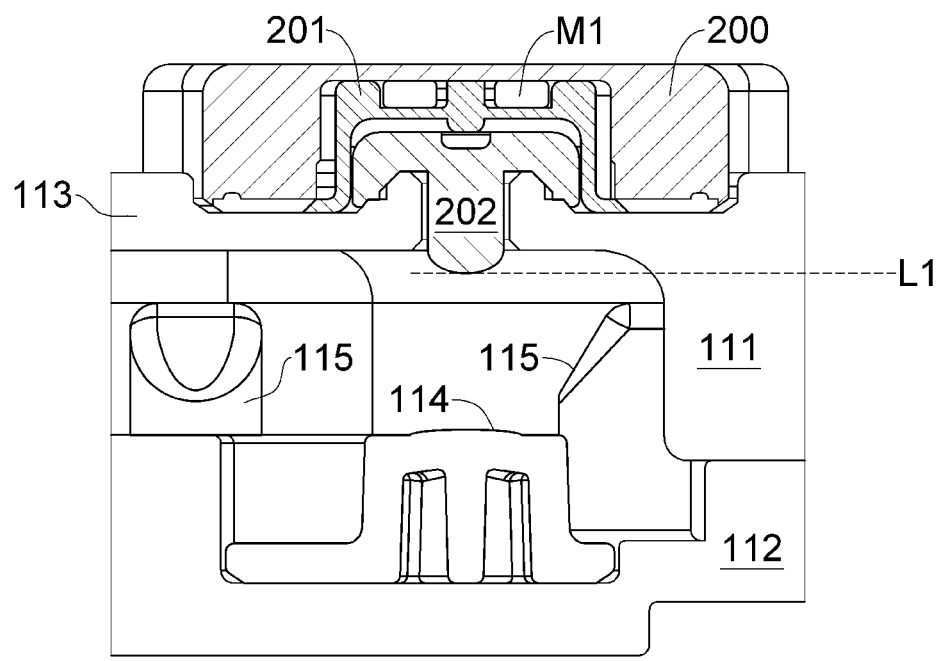
FIGS. 2A and 2B are cross-sectional views according to a dotted plane in FIG. 1, illustrating an embodiment of a pin assembly according to the present invention with and without a reticle.
Figure 2B:
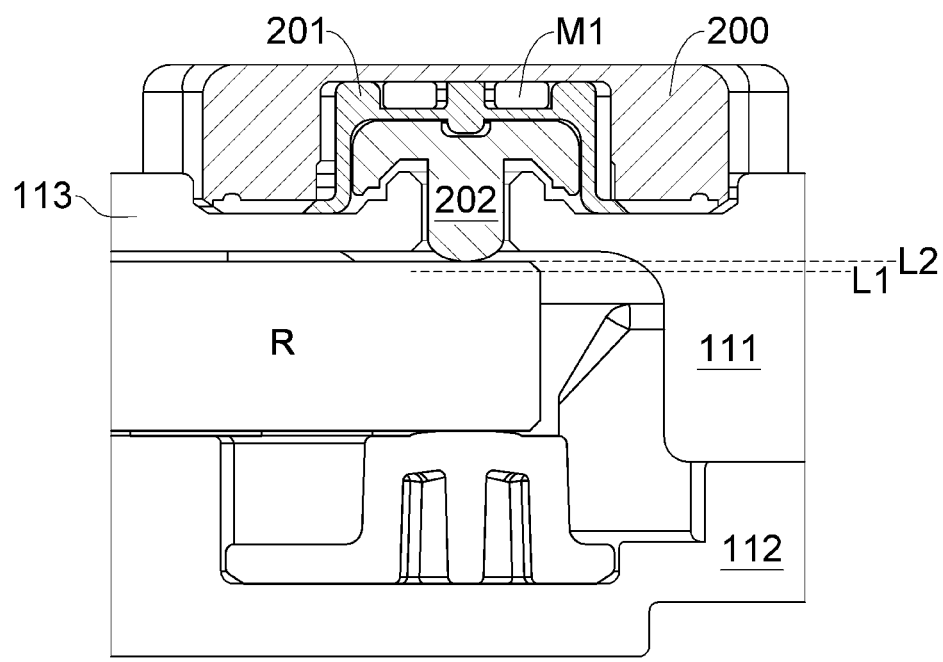

FIGS. 2A and 2B are cross-sectional views according to a plane defined by a dotted line in FIG. 1, wherein FIG. 2A illustrates a pin assembly with no reticle received in the reticle pod while FIG. 2B illustrates the pin assembly with a reticle (R) received in the reticle pod.

FIG. 2A shows the case where the lid (111) and the base (112) of reticle pod engage with each other without any reticle received therein. The lid (111) has a ceiling (113) having a relatively small thickness and a shroud portion having a relatively large thickness encircling the ceiling (113). The lid (111) engages with an upward facing surface of the base (112) mainly by the shroud portion such that an effectively hermetical seal or a semi-hermetical seal of the reticle accommodation space is formed in the inner pod (110). The base (112) is provided with multiple support assemblies. As shown in FIG. 2A, each of the support assemblies includes a support pin (114) and two limiting pins (115). These support assemblies can define a reticle accommodation area and slightly elevate the reticle above the base (112).

The lid (111) is provided with multiple pin assemblies. For example, the pin assemblies can be provided in the vicinity of the four corners of lid (111). The cross-sectional view only shows a single pin assembly which is mainly provided on the ceiling (113) of the lid (111). The pin assembly includes a cover (200), an elastic member (201) and a movable member (202).

Figure 3A:
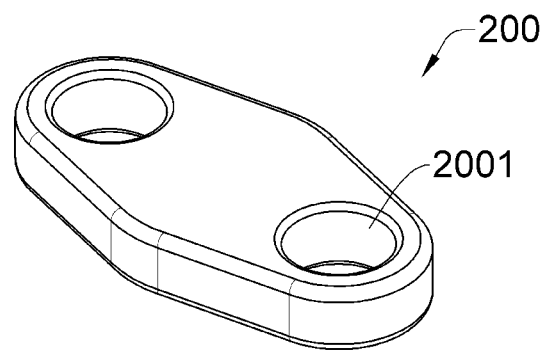
FIGS. 3A to 3C show respective components in the foregoing embodiment of the pin assembly.

Referring to FIG. 2A with FIG. 3A. The cover (200) has a relatively thin ceiling and a relatively thick wall. The ceiling is generally flat and the wall has a pair of mounting holes (2001) defined therethrough which permits a known approach for mounting the cover (200) onto a mounting position at an exterior of the ceiling (113) of the lid (111). The ceiling and wall of cover (200) as well as the lid ceiling (113) together define an accommodation space to receive a portion of the elastic member (201) and movable member (202). Means for hermetical sealing can be provided between the cover (200) and the lid ceiling (113). A height of the cover (200) can be properly selected so as to form a gap between the cover (200) and the elastic member (201).

Figure 3B:
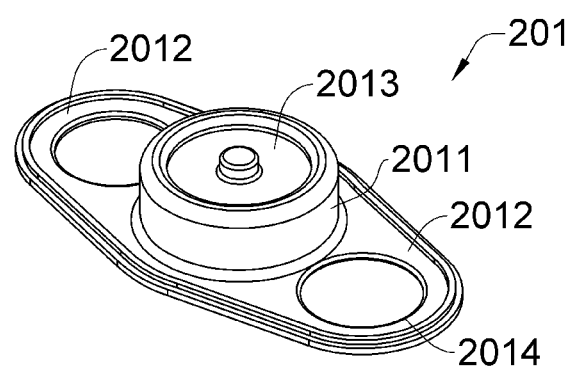

Referring to FIG. 2A with FIG. 3B. The elastic member (201) has a sleeve (2011) and a pair of mounting wings (2012) extending therefrom. The sleeve (2011) has a ceiling and a wall, the bottom of the sleeve (2011) is not sealed. The ceiling of sleeve (2011) further has a dip formed thereon for placement of a first magnet (M1). The mounting wings (2012) extend from the wall of the sleeve (2011) and has mounting holes (2014) corresponding to the foregoing mounting holes (2001). As shown in FIG. 2A, a portion of the mounting wings (2012) of elastic member (201) is sandwiched between the cover (200) and the lid ceiling (113). The sleeve (2011) size can be selected so that a gap is formed between the sleeve (2011) and cover (200), and such gap allows a certain extent of sleeve (2011) deformation, e.g. vertical and lateral deformation.

Figure 3C:
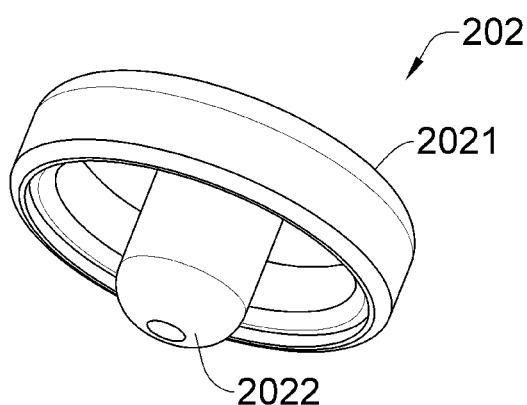

Referring to FIG. 2A with FIG. 3C. The movable member (202) has a cap (2021) and a pin (2022). The cap (2021) has a relatively large diameter. The pin (2022) extends from the bottom of the cap (2021) and penetrates through a pinhole of the lid ceiling (113) to stick out at the inside of ceiling (113). As shown in the figure, in the case where the reticle pod does not receive a reticle, a gap between the elastic member (201) and the movable member (202) located at a first level (L1) is formed. The cap (2021) is received between the elastic member (2010 and the lid ceiling (113), and the body size of cap (2021) is slightly less than that of the volume of the sleeve (2011) so that the cap (2021) is vertically movable within the sleeve (2011), which also determines a degree of the pin protrusion. The lid ceiling (113) further has a flange formed thereon for engaging with a bottom of the cap (2021).

In this embodiment, the elastic member (201) can determine a highest level at which the movable member (202) can reach, and the ceiling (113) of lid (111) can determine a lowest level at which the movable member (202) can reach when there is no reticle received. In other embodiment, the cover (200) can also determine the highest level. As illustrated in FIGS. 2A and 2B, the sleeve (2011) of elastic member (201) is deformable, and a top interior of the elastic member (201) can limit an upward movement range for the movable member (202). As shown, the top interior of the sleeve (2011) also has a bump formed thereon for matching with the cap (2021). Alternatively, the top of cover (200) can be used to limit the upward movement range for the movable member (202) as well.

As illustrated in FIG. 2A, without receiving reticle, the movable member (202) sits on the ceiling (113) by its own weight with the cap (2021) abutting the ceiling (113), and a distal end of the pin (2022) reaches the first level (L1) presented in a dash line. As illustrated in FIG. 2B, with a reticle received, the reticle thickness elevates the pin to reach a relatively higher second level (L2) so that the cap (2021) leaves the ceiling (113) and moves toward the top of elastic member (201), which may not necessarily cause a contact. The movable member (202) can still be movable. That is, there can be a small gap between the elevated movable member (202) and the top of elastic member (201), at this moment the reticle is not being held. In some possible cases where the elevated movable member (202) flexibly contacts with the top of elastic member (201) to slightly deform the sleeve (2011), the elastic member (201) and the cover (200) may still be separate with a small gap therebetween or both in flexible contact. The gap between the elastic member (201) and the movable member (202) in FIG. 2A may be generally equal to the distance between the two levels (L1 and L2) in FIG. 2B.

Figure 4:
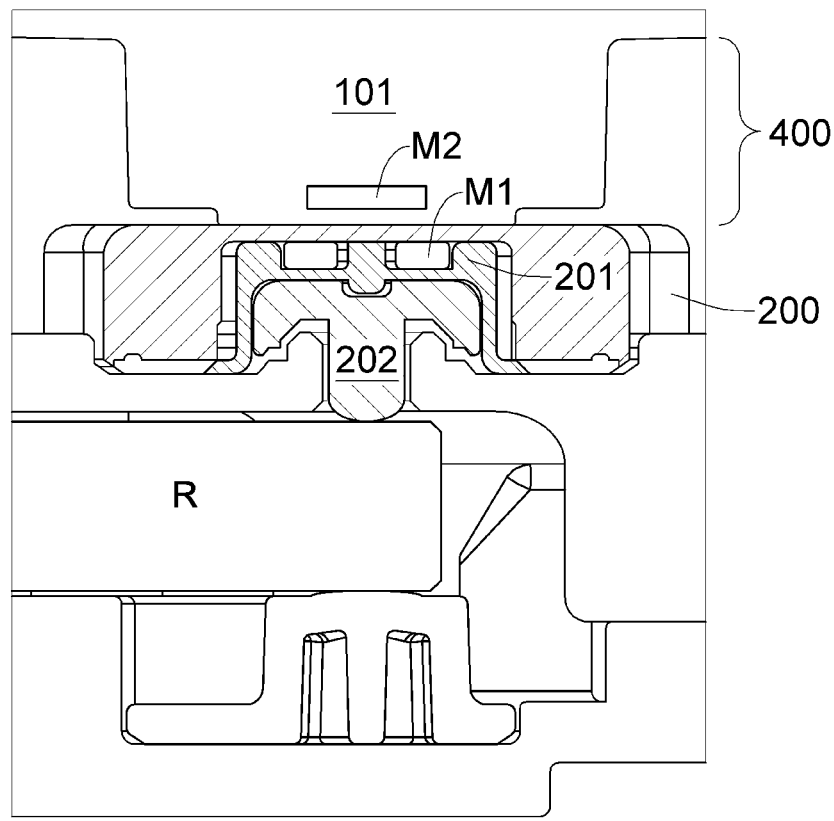
FIG. 4 illustrates an interaction between the foregoing pin assembly and a reticle.

FIG. 4 illustrates a case where a reticle outer pod lid (e.g. the lid 101 in FIG. 1) mounts onto the reticle pod. An inside of the lid (101) is provided with multiple press members (400) to correspond to the pin assemblies. A distal end of the press member (400) has a second magnet (M2) so that the second magnet (M2) can be quite adjacent to the first magnet (M1) of the pin when the distal end of the press member (400) approximates to or touches against the corresponding pin assembly. The first magnet (M1) and the second magnet (M2) have same poles facing each other and therefore the two closed magnets repel to each other which forces the elastic member (201) to deform downwardly and push the movable member toward the lower level. The pin (2022) then applies a pressing force onto an upper surface of the reticle to hold the reticle firmly. In some possible configuration, the pin (2022) may be configured to apply the press force onto an edge of the reticle.

Figure 5:
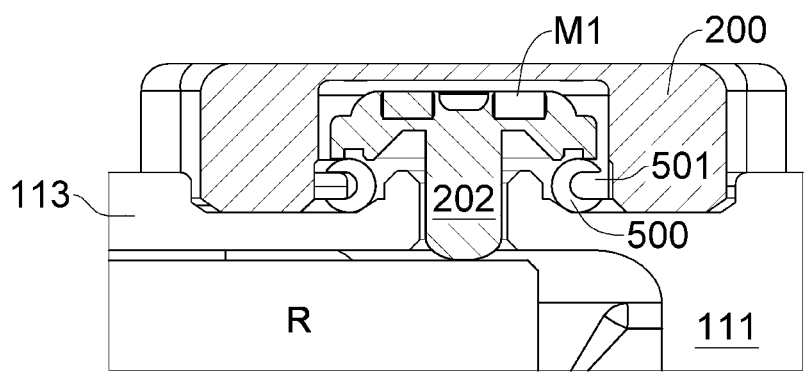
FIG. 5 illustrates another embodiment of the pin assembly according to the present invention.

FIG. 5 illustrates another embodiment of the present invention, in which the cover (200) and the movable member (202) are similar to the foregoing embodiment while the forgoing elastic member (201) is absent and the first magnet is placed on the cap instead. This embodiment provides another elastic member (500) held between the movable member (202) and the ceiling (113) of reticle pod lid (111) to provide a vertical deformation. In this configuration, the cover (200) top determines a highest level at which the movable member (202) can reach, the elastic member (500) determines a lowest level at which the movable member (202) can reach. Specifically, the elastic member (500) is an annular elastic member and connects to a connect member (501) formed on an interior of the cover (200). For example, a cross section of the annular elastic member has a recess for matching with said connect member (501).

With the press member (400) in FIG. 4 having the second magnet (M2) approaching the pin assembly in FIG. 5, the movable member (202) is forced to move toward the lower level to deform the elastic member (500). The deformation of the elastic member (500) can mitigate the downward force of the movable member (202) to avoid excess depression acted on the upper surface of the reticle.

The foregoing embodiments exemplify a contactless (indirect) pressing mechanism provided by the pin assembly composed of composited materials. The following embodiment of pin assembly according to the present invention illustrates a contact (direct) pressing mechanism.

Figure 6A:
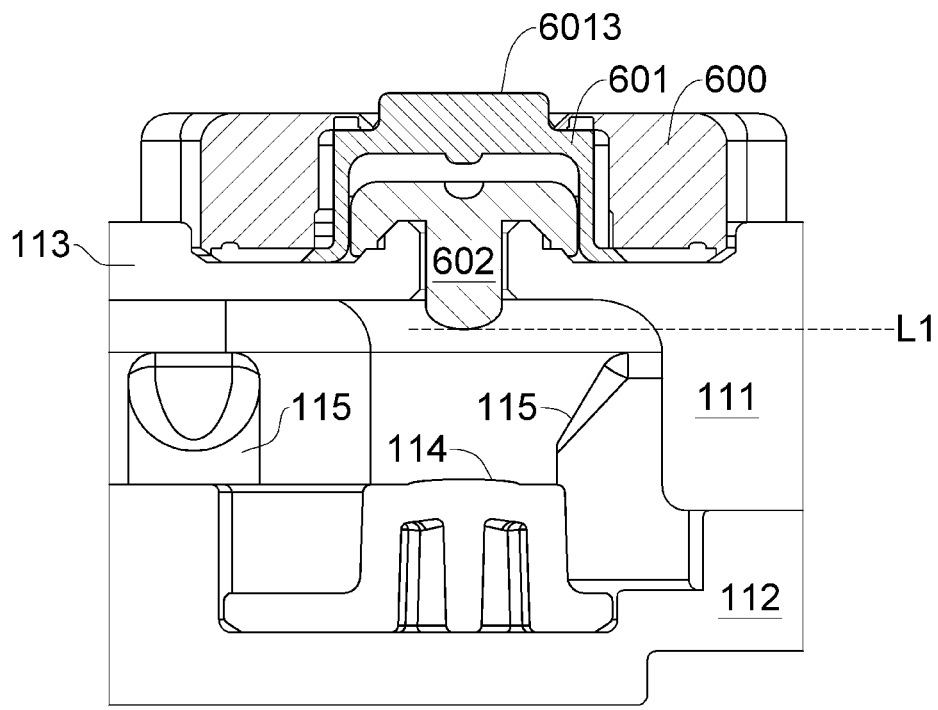
FIGS. 6A and 6B are cross-sectional views according to the dotted plane in FIG. 1, illustrating a further embodiment of the pin assembly with and without a reticle.
Figure 6B:
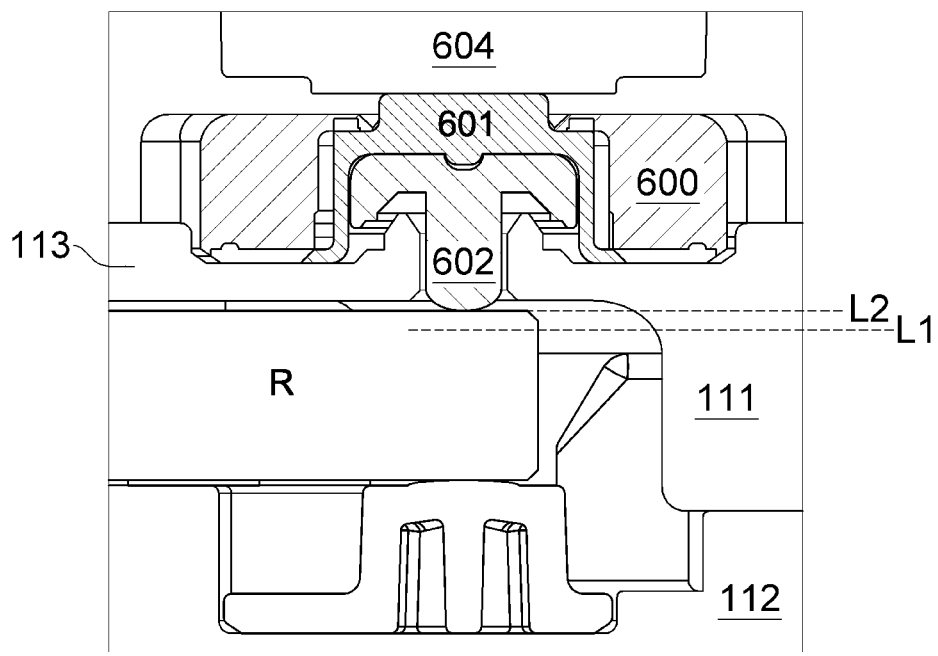

FIGS. 6A and 6B are other embodiment of the pin assembly according to the present invention, both are cross-sectional views according to the plane defined by the dotted line in FIG. 1, in which FIG. 6A illustrates a pin assembly of the reticle pod without receiving reticle and FIG. 6B illustrates the pin assembly of the reticle pod with a reticle received therein.

FIG. 6A illustrates the case where reticle pod lid (111) engages with the base (112) without receiving reticle. The lid (111) has small thickness and a shroud portion having a relatively large thickness encircling the ceiling (113). The lid (111) engages with an upward facing surface of the base (112) mainly by the shroud portion such that an effectively hermetical seal or a semi-hermetical seal of the reticle accommodation space is formed in the inner pod (110). The base (112) is provided with multiple support assemblies. As shown in FIG. 6A, each of the support assemblies includes a support pin (114) and two limiting pins (115). These support assemblies can define a reticle accommodation area and slightly elevate the reticle above the base (112).

The lid (111) is provided with multiple pin assemblies. For example, the pin assemblies can be provided in the vicinity of the four corners of lid (111). The cross-sectional view only shows a single pin assembly which is mainly provided on the ceiling (113) of the lid (111). The pin assembly includes a cover (600), an elastic member (601) and a movable member (602).

Figure 7A:
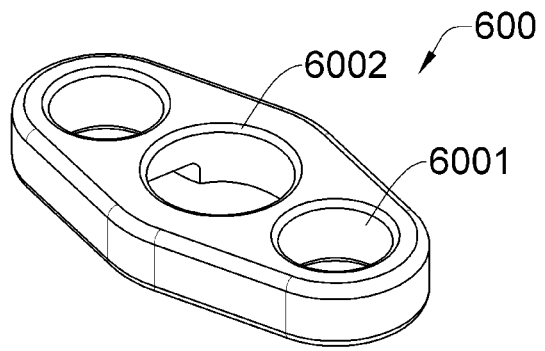
FIGS. 7A to 7C show respective components in the foregoing embodiment of the pin assembly.

Referring to FIG. 6A with FIG. 7A. The cover (600) has a relatively thin ceiling and a relatively thick wall. The ceiling is generally flat and the wall has a pair of mounting holes (6001) defined therethrough which permits a known approach for mounting the cover (600) onto a mounting position on an exterior of the ceiling (113) of the lid (111). The ceiling and wall of cover (600) as well as the lid ceiling (113) together define an accommodation space to receive a portion of the elastic member (601) and movable member (602). Said accommodation space is not sealed because of a hole (6002) opened at the center of ceiling of the cover (600), which means the accommodation space communicates with an outside of the cover (600). A height of the cover (600) and the hole (6002) size can be properly selected so as to form a gap between the cover (600) and the elastic member (601).

Figure 7B:
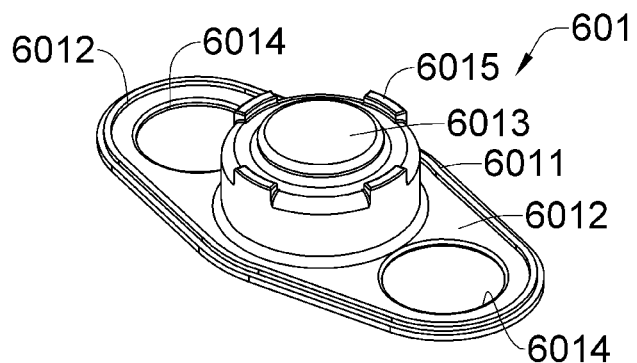

Referring to FIG. 6A with FIG. 7B. The elastic member (601) has a sleeve (6011) and a pair of mounting wings (6012) extending therefrom. The sleeve (6011) has a ceiling and a wall, the bottom of the sleeve (6011) is not sealed. The ceiling of sleeve (6011) further has a bump (6013) formed on its ceiling, the bump (6013) size is slightly smaller than the hole (6002) diameter. The mounting wings (6012) extend from the wall of the sleeve (6011) and has mounting holes (6014) corresponding to the forgoing mounting holes (6001). As shown in FIG. 6A, a portion of the mounting wings (6012) of elastic member (601) is sandwiched between the cover (600) and the lid ceiling (113). The sleeve (6011) size can be selected so as to form a gap between the sleeve (6011) and cover (600), and such gap allows a certain extent of sleeve (6011) deformation, e.g. vertical and lateral deformation. In addition, the bump (6013) exposes from the hole (6002) of the cover (600), especially the bump (6013) stick out of an upward facing surface of the cover (600) ceiling without any force applied thereto. The illustrated bump (6013) has an upward flat surface; however, it can be an inclined surface or a curved surface instead. Multiple support blocks (6015) can further be formed at a periphery of the bump (6013), the support blocks (6015) abut against an interior of the cover (600) to stabilize the sleeve (6011). It is noted that means for hermetical seal should be provided between the cover (600) and the mounting wings (6012) to avoid air from entering the reticle pod through the hole (6002).

Figure 7C:
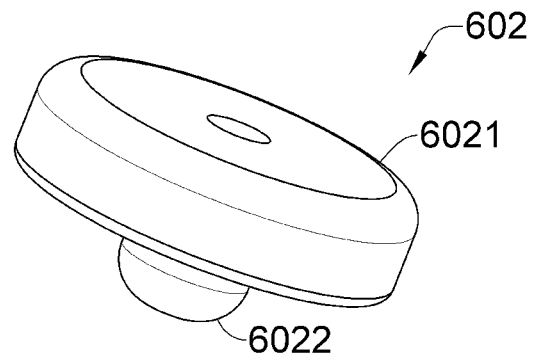

Referring to FIG. 6A with FIG. 7C. The movable member (602) has a cap (6021) and a pin (6022). The cap (6021) has a relatively large diameter. The pin (6022) extends from the bottom of the cap (6021) and penetrates through a pinhole of the lid ceiling (113) to stick out at the inside of ceiling (113). As shown in the figure, in the case where the reticle pod does not receive a reticle, a gap between the elastic member (601) and the movable member (602) located at a first level (L1) is formed. In addition, in the case where the reticle pod does not receive a reticle (R), the pin (6022) with an amount sticks out of a downward facing surface of the ceiling (113), which is larger than a distance between an upper surface of the reticle (R) when received and the downward facing surface of the lid ceiling (113). The cap (6021) is received between the elastic member (6010) and the lid ceiling (113), and the body size of cap (6021) is slightly less than that of the volume of the sleeve (6011) so that the cap (6021) is vertically movable within the sleeve (6011), which also determines a degree of the pin protrusion. The lid ceiling (113) further has a flange formed thereon for engaging with a bottom of the cap (6021). The movable member (602) may be made of a material that is relatively hard than that of the elastic member (601).

In this embodiment, the elastic member (601) determines a highest level at which the movable member (602) can reach, and the ceiling (113) of lid (111) determines a lowest level at which the movable member (602) can reach. In other embodiment, the cover (600) can also determine the highest level. As illustrated in FIGS. 6A and 6B, the sleeve (6011) of elastic member (601) is deformable, and a top interior of the elastic member (6011) can limit an upward movement range for the movable member (602). As shown, the top interior of the sleeve (6011) also has a bump formed thereon for matching with the cap (6021). Alternatively, the top of cover (600) can be used to limit the upward movement range for the movable member (602) as well.

As illustrated in FIG. 6A, without receiving reticle, the movable member (602) sits on the ceiling (113) by its own weight with the cap (6021) abutting the ceiling (113), and a distal end of the pin (6022) reaches the first level (L1) presented in a dash line. As illustrated in FIG. 6B, with a reticle received, the reticle thickness elevates the pin to reach the relatively higher second level (L2) so that the cap (6021) leaves the top (113) and moves toward the top of elastic member (601), which may not necessarily cause a contact. The movable member (602) can still be movable. That is, there can be a small gap between the elevated movable member (602) and the top of elastic member (601), at this moment the reticle is not being held. In some possible cases where the elevated movable member (602) flexibly contacts with the top of elastic member (601) to slightly deform the sleeve (6011), and the bump (6013) is slightly elevated as well. The gap between the elastic member (601) and the movable member (602) in FIG. 6A may be generally equal to the distance between the two levels (L1 and L2) in FIG. 6B.

FIG. 6B further illustrates the case where a reticle outer pod lid (e.g. the lid 101 in FIG. 1) mounts onto the reticle pod. An interior of the lid (101) is provided with multiple press members (604) to correspond to the pin assemblies. A distal end of the press member (604) has a flat surface so that the flat surface can contact with and step onto the corresponding exposed bump (6013) when the distal end of the press member (604) approximates to or touches against the corresponding pin assembly. The deformation of elastic member (601) is subject to the force applied by the press member (604), and the deformed elastic member (601) pushes the movable member (602) toward the lower level. The pin (6022) then applies a pressing force onto an upper surface of the reticle to hold the reticle firmly. In some possible configuration, the pin (6022) may be configured to apply the press force onto an edge of the reticle.

In other possible embodiments, the distal end of the press member (604) is not necessarily a flat surface. The distal end of the press member (604) may be structured to match with the hole (6002) of the cover (600) so that the press member (604) is able to slightly enter the cover (600). The bump (6013) does not necessarily have to stick out of the top surface of the cover (600). The bump (6013) may be at a level below the hole (6002). Alternatively, the cover (600) may be taller than the bump (6013).

Figure 8:
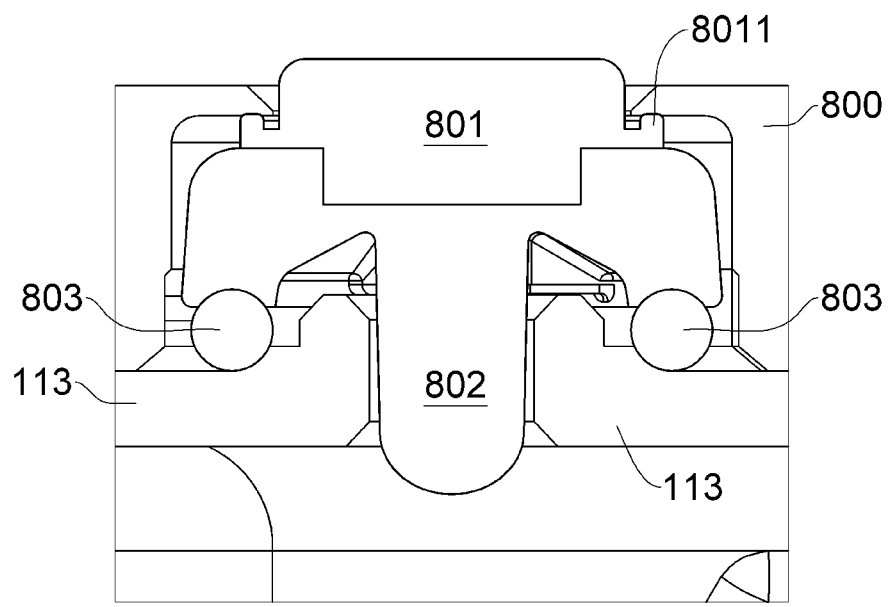
FIG. 8 illustrates yet another embodiment of the pin assembly according to the present invention.

FIG. 8 illustrates a further embodiment of the pin assembly according to the present invention, which includes a cover (800), a first elastic member (801), a movable member (802) and a second elastic member (803). The cover (800) is similar with the forgoing cover (600) in FIG. 7A. The first elastic member (801) is placed between a ceiling of the cover (800) and a cap of the movable member (802), and the first elastic member (801) is in contact with both the ceiling of cover (800) and the cap of the movable member (802). The second elastic member (803) is placed between the movable member (802) and the lid ceiling (113), and the second elastic member (803) is in contact with the movable member (802) and the lid ceiling (113).

The first elastic member (801) has a bump formed on its ceiling, the bump exposes through a hole of the cover (800) and sticks out of the ceiling of cover (800). The first elastic member (801) may have support blocks (8011) or a support annular formed on its side, which is similar to the foregoing support block (6015) in FIG. 7B and configured to abut the interior of cover (800) to stabilize the movable member (802). The first elastic member (801) can be mounted onto the cap of the movable member (802) in advance, then the cover (800) can be put on to complete their contact. Specifically, the second elastic member (803) can be an O-ring, the movable member (802) may have a proper structure formed on a bottom thereof for matching with the second elastic member (803). Thereby, the cover (800) and the first elastic member (801) may determine a highest level at which the movable member (802) can reach when a reticle is elevated, the second elastic member (803) may determine a lowest level at which the movable member (802) can reach when pressed by foregoing press member. In other possible embodiment, the first elastic member (801) may be provided with foregoing first magnet (M1), and the bump top of first elastic member (801) may be under the ceiling of cover (800).

In the foregoing embodiments, the elastic members (201, 601) as well as movable members (202, 602) are members independent from each other, while the elastic member (801) and movable member (802) connect with each other. Despite of that, in other possible embodiment and interpretation, the elastic member may be deemed as a part of the cap of the movable member. In other words, the elastic member as a whole or in part may be deemed as a part of the whole movable member. Thus, applying a force to the cap of the movable member may be equivalent to applying force to said elastic member.

In the foregoing embodiments, said elastic member is formed of a resilient or soft material for absorbing excess pressing force from the press member. The elastic member may be made of a material with relatively small hardness, such as Shore Durometer ranging from 20 to 80. Alternatively, the elastic member hardness can be achieved by changing structural feature of material, such as porous or hollow structure.

In view of the foregoing embodiment description, the present invention discloses a reticle pod whose information is identifiable by machine platform and a method for identifying such reticle pod, so that processing apparatus that is provided with laser detection manner can further provide reticle pod information identification, improving data manipulation in manufacturing process.

What is claimed is:

1. A reticle pod, having a lid and one or more pin assemblies provided on the lid, the pin assembly comprising:
   a movable member configured to be movable relatively to a ceiling of the lid; and
   an elastic member configured to mount on the ceiling of the lid to define an accommodation space receiving the movable member so that the movable member is retained between the elastic member and the ceiling of the lid without exposing the movable member;
   wherein the ceiling of the lid is configured to determine the movable member locates at a first level when the reticle pod does not receive a reticle; and the elastic member is configured to cooperate with the movable member such that the movable member locates at a second level to hold a reticle when the reticle pod receives the reticle, the second level is higher than the first level.

2. The reticle pod as claimed in claim 1, wherein a gap is defined between the elastic member and the movable member located at the first level when the reticle pod does not receive the reticle.

3. The reticle pod as claimed in claim 2, wherein the gap substantially equals to a distance between the first level and the second level.

4. The reticle pod as claimed in claim 2, wherein the elastic member is further configured to receive either a directly or an indirectly external force such that the elastic member interacts with the movable member to hold the reticle when the reticle pod receives the reticle.

5. The reticle pod as claimed in claim 1, wherein the movable member has a cap and a pin, the cap is limited between the elastic member and the ceiling of the lid, the pin extends from the cap to an inside of the reticle pod.

6. The reticle pod as claimed in claim 1, wherein the lid is provided with one or more covers, the cover mounts to the lid to cover the elastic member connecting to the lid.

7. The reticle pod as claimed in claim 6, wherein the elastic member has a sleeve and a pair of mounting wings, the pair of mounting wings is configured to connect to the ceiling of the lid, the sleeve and the ceiling of the lid define the accommodation space for receiving the movable member in part.

8. The reticle pod as claimed in claim 1, wherein the elastic member has a sleeve and a pair of mounting wings, the pair of mounting wings is configured to connect to the ceiling of the lid, the sleeve and the ceiling of the lid define the accommodation space for receiving the movable member in part.

9. The reticle pod as claimed in claim 8, wherein the sleeve has a ceiling facing the cover, and a first magnet is placed on the ceiling of the sleeve.

10. The reticle pod as claimed in claim 9, further comprising a reticle outer pod having a lid, and the lid of the reticle outer pod is provided with one or more press members corresponding to the pin assemblies, and the press member being provided with a second magnet, wherein the first magnet and the second magnet are configured in a way such that the press member provides a contactless pressing to the corresponding pin assembly to thereby force the movable member moving toward an inside of the reticle pod.

11. The reticle pod as claimed in claim 1, wherein the lid has one or more covers mounted thereon to partially expose the elastic member connected to the lid.

12. The reticle pod as claimed in claim 11, wherein the elastic member has a sleeve and a pair of mounting wings, the pair of mounting wings is configured to connect to the ceiling of the lid, the sleeve and the ceiling of the lid define the accommodation space for receiving the movable member in part, a ceiling of the sleeve is exposed through a hole of the cover.

13. The reticle pod as claimed in claim 12, wherein the ceiling of the sleeve sticks out of the ceiling of the cover.

14. The reticle pod as claimed in claim 12, further comprising a reticle outer pod having a lid, and the lid of the reticle outer pod is provided with one or more press members corresponding the pin assemblies such that the press member provides a contact pressing to the exposed ceiling of the sleeve of the corresponding pin assembly to thereby force the movable member moving toward an inside of the reticle pod.

15. A reticle pod, having a lid and one or more pin assemblies provided on the lid, the pin assembly comprising:
   a movable member configured to be movable in a vertical direction relatively to a ceiling of the lid, the movable member including a cap and a pin penetrating through a hole defined on the lid and sticking out of a bottom surface of the lid; and
   a cover mounted on an exterior of the lid to define an accommodation space receiving the movable member and an elastic member configured to enclose the cap of the movable member such that the movable member is retained between the ceiling of the lid and the elastic member without exposing the cap, and the cover and the elastic member together determining a highest level at which the cap of the movable member is able to reach;
   wherein the pin touches against an upper surface of a reticle when the reticle is received in the reticle pod; and the cap forces the pin to hold the reticle when the cap receives either a direct or an indirect external force.

16. The reticle pod as claimed in claim 15, wherein the elastic member hermetically seals the hole of the lid.

17. The reticle pod as claimed in claim 15, wherein an amount of the pin sticks out of the bottom surface when the reticle pod does not receive the reticle, and said amount is at least larger than a distance between the upper surface of the reticle when received in the reticle pod and the bottom surface of the lid.

18. The reticle pod as claimed in claim 15, wherein the external force is applied by a reticle outer pod when the reticle pod receives the reticle.

19. The reticle pod as claimed in claim 18, wherein the cap is provided with a first magnet, the external force is a repelling force applied to the first magnet when the reticle pod receives the reticle.

20. The reticle pod as claimed in claim 19, wherein the reticle outer pod has a lid provided with one or more press members corresponding to the pin assemblies, the press member is provided with a second magnet, the first magnet and the second magnet are configured in a way such that the press member provides a contactless pressing to the corresponding pin assembly to thereby force the movable member moving toward an inside of the reticle pod.

21. The reticle pod as claimed in claim 15, wherein the accommodation space defined by the cover and the exterior of the lid receives another elastic member which is an annular elastic member connecting to an interior of the cover.

* * * * *